United States Patent
Cho

[19]

[11] Patent Number: 6,137,368
[45] Date of Patent: Oct. 24, 2000

[54] FREQUENCY SYNTHESIZER WITH CONSTANT LOOP CHARACTERISTICS

[75] Inventor: Young-Kyun Cho, Seoul, Rep. of Korea

[73] Assignee: Samsung Electronics Co., Ltd., Kyungki-do, Rep. of Korea

[21] Appl. No.: 09/339,277

[22] Filed: Jun. 23, 1999

[30] Foreign Application Priority Data

Jun. 23, 1998 [KR] Rep. of Korea ...................... 98-23611

[51] Int. Cl.$^7$ ..................................................... H03L 7/18
[52] U.S. Cl. .............................. 331/16; 331/25; 327/156; 327/157
[58] Field of Search .................................. 331/16, 18, 25; 327/105, 156–159; 375/376; 455/260

[56] References Cited

U.S. PATENT DOCUMENTS

| 3,769,602 | 10/1973 | Griswold | 329/122 |
| 3,890,619 | 6/1975 | Mounce | 343/105 R |
| 4,862,109 | 8/1989 | Cowley | 331/16 |
| 5,710,526 | 1/1998 | Nauta et al. | 331/25 |
| 5,832,375 | 11/1998 | Leisten et al. | 455/314 |

*Primary Examiner*—David Mis
*Attorney, Agent, or Firm*—F. Chau & Associates, LLP

[57] ABSTRACT

A frequency synthesizer is provided. The synthesizer includes a phase detector for receiving an input signal and a feedback signal and for generating a phase error signal corresponding to a difference between the input signal and the feedback signal. A charge pump generates a charge pump signal having a polarity controlled by the phase error signal. A variable oscillator generates an oscillation signal in response to the charge pump signal. A first frequency divider divides a frequency of the oscillation signal by a first divisor to produce a first divided output signal as an output signal of said frequency synthesizer. A second frequency divider divides a frequency of the first divided output signal by a second divisor to produce the feedback signal. A loop adjustor adjusts the first signal divisor in response to the second signal divisor or adjusts the second signal divisor in response to the first signal divisor. The adjustment is performed so as to constantly maintain the product of the first divisor and the second divisor. The present invention allows for the PLL loop characteristics to remain unchanged. Moreover, since loop characteristics remain unchanged, additional circuitry is not required to adjust the loop characteristics.

17 Claims, 2 Drawing Sheets

FREQUENCY SYNTHESIZER WITH CONSTANT LOOP CHARACTERISTICS

FIELD OF THE INVENTION

The present invention relates generally to frequency synthesizers and, more particularly, to a frequency synthesizer having a phase-locked loop (PLL) with constant loop characteristics.

BACKGROUND OF THE INVENTION

A frequency synthesizer having a PLL typically includes an input frequency divider for dividing a corresponding input signal and an output frequency divider for dividing a corresponding output signal. At phase-lock, a synthesized output frequency $f_o$ is proportional to an input frequency $f_i$ by the relationship shown in equation (1), where M and N denote the divisors of the input and output frequency dividers.

$$f_o = N/M \, f_i \qquad (1)$$

Although M and N have the relationship of divisor and a dividend, respectively, in equation 1, reference will be hereinafter made to both M and N as divisors. From equation (1) it can be seen that a desired output frequency, for example, twice a current output frequency, is obtained by adjusting variables such as input frequency $f_i$, divisor M, and/or divisor N. If $f_i$ and M are constant, then divisor N is doubled to obtain the desired output frequency. Alternatively, if $f_i$ and N are normally held constant, the divisor M is halved to obtain the desired output frequency. A wide range of output frequencies may be calculated from equation (1) by varying the values of the divisors M and N.

However, the practical limit of the output frequency range of a PLL is often defined by dynamic loop characteristics underlying the PLL. The loop characteristics include loop variables such as loop bandwidth, natural frequency, damping factor, and so on. Values of the loop characteristics are typically based upon present parameters of components of the PLL. The present parameters typically prevent frequency synthesis outside a predefined range of the PLL.

When a frequency synthesizer having a PLL attempts to synthesize a frequency within a frequency range of the PLL, the frequency synthesis typically succeeds. However, when such a frequency synthesizer attempts to synthesize a frequency outside the predefined frequency range, the synthesis often fails.

There is currently a need for a frequency synthesizer having a PLL adapted for providing a larger range of synthesized frequencies. To meet this need, a digital-to-analog converters (DAC) have been used in frequency synthesizers to provide accurate frequency deviation. Such an approach is described in U.S. Pat. No. 5,631,587, entitled, "FREQUENCY SYNTHESIZER WITH ADAPTIVE LOOP BANDWIDTH", Roman S. Co et al., issued on May 20, 1997, the disclosure of which is incorporated by reference herein. Such a frequency synthesizer requires additional blocks and control pins for the DAC. Thus, a frequency synthesizer design employing a DAC is more difficult and complex. Accordingly, it would be desirable and highly advantageous to have a frequency synthesizer which has a large range of synthesized frequencies, but that does not require additional blocks and control pins.

SUMMARY OF THE INVENTION

It is therefore an object of the present invention to provide an improved frequency synthesizer which generates a large variable range of output frequencies without requiring a change to the initial PLL characteristics.

According to an aspect of the present invention, there is provided a frequency synthesizer which includes a phase detector for receiving an input signal and a feedback signal and for generating a phase error signal corresponding to a difference between the input signal and the feedback signal. A charge pump generates a charge pump signal having a polarity controlled by the phase error signal. A variable oscillator generates an oscillation signal in response to the charge pump signal. A first frequency divider divides a frequency of the oscillation signal by a first divisor to produce a first divided output signal as an output signal of said frequency synthesizer. A second frequency divider divides a frequency of the first divided output signal by a second divisor to produce the feedback signal. A loop adjustor adjusts the first signal divisor in response to the second signal divisor or adjusts the second signal divisor in response to the first signal divisor. The adjustment is performed so as to constantly maintain the product of the first divisor and the second divisor. The present invention allows for the PLL loop characteristics to remain unchanged. Moreover, since loop characteristics remain unchanged, additional circuitry is not required to adjust the loop characteristics.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DESCRIPTION OF PREFERRED EMBODIMENTS

Figure 1:
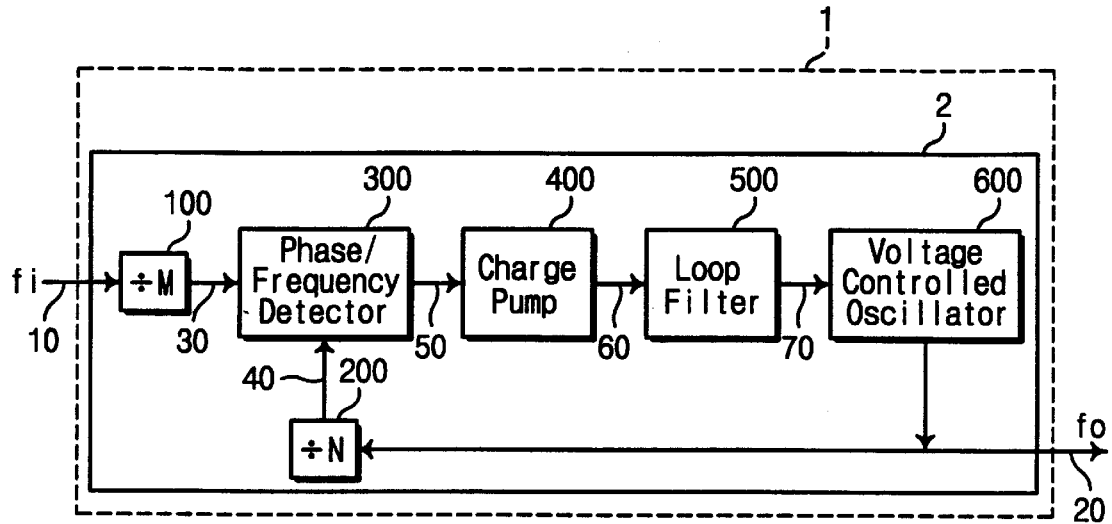
FIG. 1 is a block diagram of a conventional frequency synthesizer.

FIG. 1 is a block diagram of a conventional frequency synthesizer 1 incorporating a phase-locked loop (PLL) 2. An input signal having an input frequency $f_i$ is provided to the frequency synthesizer 1 via signal line 10. The frequency synthesizer 1 provides an output signal having an output frequency $f_o$ via signal line 20. The input frequency $f_i$ is divided by an input frequency divisor M of an input frequency divider 100, and the output frequency $f_o$ is divided by an output frequency divisor N of an output frequency divider 200. The values of M and N are user-programmable and are commonly integers. The output frequency $f_o$ is related to the input frequency $f_i$ as shown in equation (1).

In a phase/frequency detector 300, the phase of a divided input signal on line 30 and the phase of a divided output signal on signal line 40 are compared. The phase/frequency detector 300 generates a difference signal on signal line 50. The difference signal corresponds to a time difference measured when the divided input signal on signal line 30 leads the divided output signal on signal line 40, or when the divided input signal on signal line 30 lags the divided output signal on signal line 40.

A charge pump 400 can be embodied as a current pump or a voltage pump. In response to the difference signal on signal line 50, the charge pump 400 delivers a charge pump signal of zero magnitude or magnitude I on signal line 60. The charge pump signal on signal line 60 has, for example, a positive $I^+$ or a negative $I^-$ depending on the difference signal on signal line 50.

The charge pump signal on signal line 60 is subsequently filtered by a loop filter 500 typically constructed as a low pass filter. An illustrative low pass filter has an impedance Z(s) as shown in equation (2). At low operating frequencies, the capacitor C will dominate the impedance Z(s), and at high operating frequencies, the resistor R will dominate the impedance Z(s)

$$Z(s) = R + \frac{1}{Cs} \qquad (2)$$

A variable oscillator 600 can be embodied as a voltage controlled oscillator (VCO) or a current-controlled oscillator. The VCO 600 receives the filtered signal on signal line 70, and oscillates in response to the filtered signal.

The VCO 600 has an associated gain factor represented by $K_o$. The output oscillation signal of the VCO 600 is the output signal of the frequency synthesizer 1 that is output via signal line 20. When the frequency synthesizer 1 is phase-locked, the output signal on signal line 20 is locked at a desired output frequency $f_o$.

The dynamic performance of the PLL 2 can be represented by loop characteristics such as a loop bandwidth K, a natural frequency ω, a damping factor ζ, and so on. These loop characteristics are related to values of the components in the PLL 2 such as the charge pump magnitude I, the resistance R and capacitance C of the loop filter 500, the gain factor $K_o$ of the VCO 600, and the input divisor M and output divisor N. Equations (3) to (5) illustrate the relationships of the loop characteristics.

$$K = \frac{Ko}{N} \frac{I}{2\pi} RM \qquad (3)$$

$$\omega = \sqrt{\frac{Ko}{N} \frac{I}{2\pi C} M} \qquad (4)$$

$$\zeta = \frac{R}{2} \sqrt{\frac{Ko}{N} \frac{IC}{2\pi} M} \qquad (5)$$

The values of the components of the PLL 2 in the frequency synthesizer 1, such as I, R, C, and $K_o$, are held constant, whereas the values of M and N can be adjusted to synthesize different output frequencies.

If the value of the output divisor N is halved, it can be seen from equation (1) that the output frequency $f_o$ should correspondingly be halved. However, problems may arise in the PLL 2 because of the relationship of the output divisor N to the loop characteristics illustrated in equations (3) to (5). For example, if the value of the output divisor N is quadrupled, then the loop bandwidth K is quartered, and the natural frequency ω and the damping factor ζ are halved. However, by halving the damping factor ζ, the PLL 2 may become undamped so as to generate an unstable output frequency. Because the PLL characteristics vary in response to M and N according to equations (3) to (5) and not to equation (1), the variations tend to limit the output frequency range of the frequency synthesizer 1.

As described above, various output frequency ranges of the conventional frequency synthesizer 1 can be obtained by controlling the values of the input divisor M and the output divisor N. However, as shown in equations (3) to (5), PLL characteristics, such as the loop bandwidth K, the natural frequency ω, and the damping factor ζ, are adjusted by varying the values of the divisors M and N (especially, the divisor N). For more stable PLL characteristics in a range of the output frequency of the frequency synthesizer 1, the current of the charge pump 400, the impedance of the loop filter 500, and the gain of the voltage-controlled oscillator 600 must be adjusted following the various output frequencies. However, it is to be appreciated that the complexity of the composition of the frequency synthesizer is generally proportional to the complexity of the circuits used to adjust the PLL characteristics (not shown). It is to be further appreciated that the required chip area for the frequency synthesizer increases when additional control pins are required.

Figure 2:
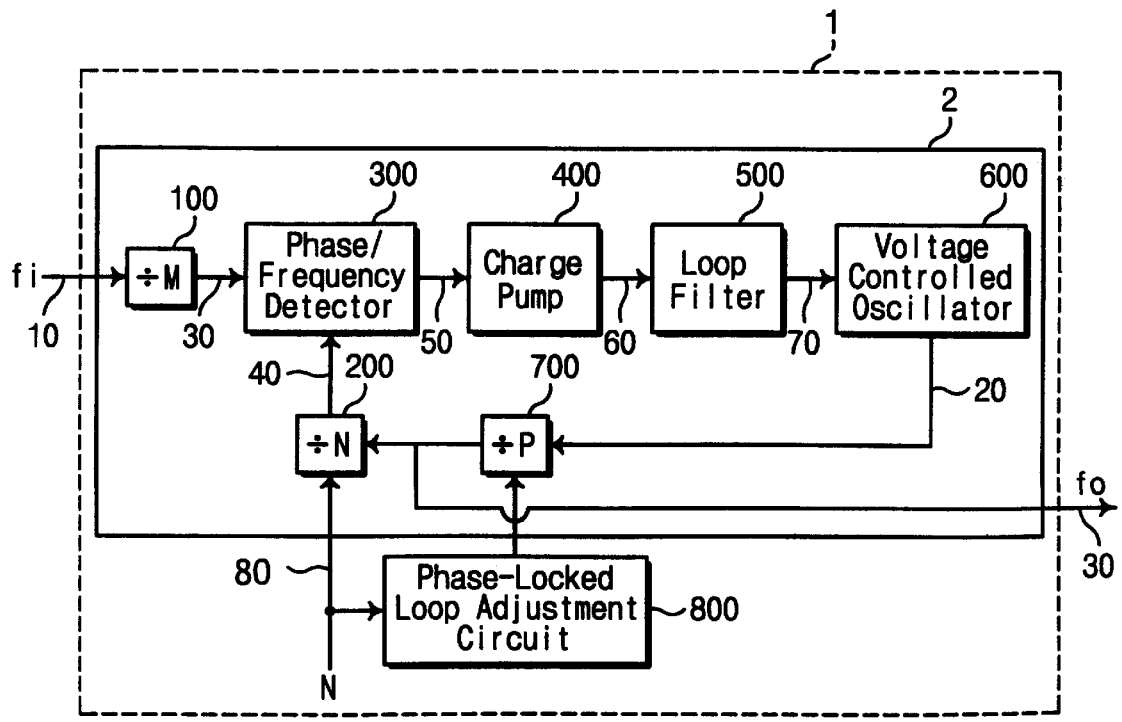
FIG. 2 is a block diagram illustrating a frequency synthesizer according to a preferred embodiment of the present invention.

FIG. 2 illustrates a block diagram of the frequency synthesizer 1 including the PLL 2 in accordance with one embodiment of the invention. In FIG. 1, identical parts as those depicted in FIG. 1 are represented with identical reference numbers. The description of such identical parts are omitted to avoid unnecessary duplicity.

The PLL circuit 2 includes: the first frequency divider 200 having the first divisor N; the phase/frequency detector 300 coupled to the first frequency divider 200 via the signal line 40; the charge pump 400 coupled to the phase/frequency detector 300 via the signal line 50; the loop filter 500 coupled to the charge pump 400 via the signal line 60; the voltage-controlled oscillator 600 coupled to the loop filter 500 via the signal line 70; and a second frequency divider 700 having a second divisor P coupled to the voltage-controlled oscillator 600 and the first frequency divider 200, the latter coupling via the signal line 20. Further, the frequency synthesizer 1 includes a phase-locked loop adjustment circuit 800 coupled to the first frequency divider 200 and the second frequency divider 700, the former coupling via signal line 80.

According to a preferred embodiment of the present invention, the gain and the loop bandwidth of the voltage-controlled oscillator 600 are set to generate the highest frequency among the synthesized frequencies from the frequency synthesizer 1. The first divisor N is adjusted to increase the frequency of the output signal and the second divisor P is adjusted to decrease the frequency of the output signal, as will be more fully described later.

Referring again to FIG. 2, the phase-locked loop adjustment circuit 800 maintains a value obtained by multiplying the first divisor N by the second divisor P. In the embodiment of FIG. 2, the phase-locked loop adjustment circuit 800 automatically adjusts the second divisor P of the second frequency divider 700 in response to the first divisor N of the first frequency divider 200. For example, consider the case when a value obtained by multiplying the divisor N by the divisor P corresponding to a closed loop of the PLL 2 is "10", the voltage-controlled oscillator 600 generates a 100 MHZ oscillated signal, and the desired output frequency is 50 MHZ. In order to obtain the desired output frequency of 50 MHZ while maintaining the value of 10, the first divisor N of the first frequency divider 200 is set to "5". Then, the phase-locked loop adjustment circuit 800 automatically adjusts the second divisor P to "2" in response to the first divisor N, thus maintaining the value of "10". The oscillated signal of 100 MHZ from the voltage-controlled oscillator 600 is divided by the second divisor P (i.e., 2) of the second frequency divider 700, so that the output frequency is adjusted to 50 MHZ.

In accordance with the above described, in the case when a 20 MHz output frequency is desired and the first divisor N is set to "2", the phase-locked loop adjustment circuit 800 automatically sets the second divisor P to "5" to provide the 20 MHz output frequency. Thus, according to the present invention, the value of the product resulting from multiplying the first divisor N by the second divisor P can be constantly maintained. Various output frequencies can be obtained by adjusting the second divisor P, as well constant maintenance of the loop characteristics related to the component parameters of the PLL, such as the current of the charge pump 400, the impedance of the loop filter 500, and the gain of the voltage-controlled oscillator 600. The phase-locked loop adjustment circuit 800 may be readily embodied by one skilled in the related art using a combination of logic circuits.

Figure 3:
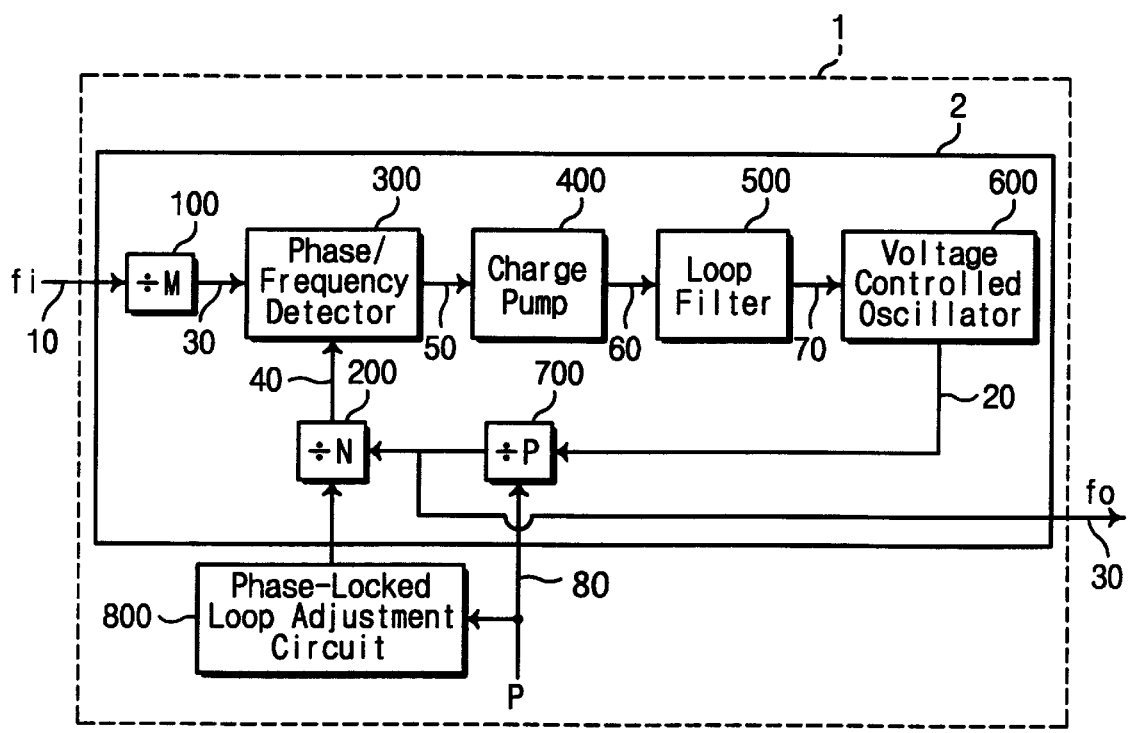
FIG. 3 is a block diagram illustrating a frequency synthesizer according to another embodiment of the present invention.

FIG. 3 illustrates a block diagram of the frequency synthesizer 1 including the PLL 2 in accordance with another embodiment of the invention. In FIG. 3, identical parts as those depicted in FIG. 2 are represented with identical reference numbers. The description of such identical parts are omitted to avoid unnecessary duplicity.

In another embodiment of the present invention, the input and the output of the phase-locked loop adjustment circuit 800 are different from those shown in FIG. 2. The phase-locked loop adjustment circuit 800 automatically adjusts the first divisor N in response to the second divisor P (as opposed to the previous embodiment, wherein the second divisor P is automatically adjusted in response to the first divisor N) so as to constantly maintain the value of the product obtained by multiplying the first divisor N by the second divisor P. The phase-locked loop adjustment circuit 800 executes the same overall operations as that of the phase-locked loop adjustment circuit 800 of FIG. 2.

In the above described embodiments of the present invention, when the divisor N or P is adjusted by the phase-locked loop adjustment circuit 800 for the various output frequencies of the output signal, the value of the product obtained by multiplying the divisor N by the divisor P can be constantly maintained. As a result, since the value of the product is constantly maintained, the PLL characteristics according to equations (3) to (5) are not changed. Hence, the voltage-controlled oscillator 600 is adjusted to generate a medium frequency of the frequencies that can be practicably synthesized, so that the voltage-controlled oscillator 600 can be designed in a narrow frequency range. As well known in the art, jitter characteristics related to the performance of a PLL are further improved when a frequency range is narrowed.

The frequency synthesizer according to the present invention (i.e., the first frequency divider 200, the phase/frequency detector 300, the charge pump 400, the loop filter 500, the voltage-controlled oscillator 600, the second frequency divider 700, and the phase-locked loop adjustment circuit 800) may be formed on a monolithic integrated circuit.

As described above, a wide range frequency synthesizer having constant loop characteristics (or, initial stable states) can be realized by constantly maintaining the value of the product obtained by multiplying the divisors related to the closed loop of the PLL circuit. The preceding may be realized without additional circuitry, such as, for example, a digital-to-analog converter (DAC) as described above. Furthermore, there is no need to adjust the loop characteristics, such as the current of the charge pump 400, the impedance of the loop filter 500 (i.e., a RC time constant), and a gain of the voltage-controlled oscillator 600, since the loop characteristics are not changed.

Although the illustrative embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A frequency synthesizer, comprising:

a phase detector for receiving an input signal and a feedback signal and for generating a phase error signal corresponding to a difference between the input signal and the feedback signal;

a charge pump for generating a charge pump signal having a polarity controlled by the phase error signal;

a variable oscillator for generating an oscillation signal in response to the charge pump signal;

a first frequency divider for dividing a frequency of the oscillation signal by a first divisor to produce a first divided output signal as an output signal of said frequency synthesizer;

a second frequency divider for dividing a frequency of the first divided output signal by a second divisor to produce the feedback signal; and a loop adjustor for at least one of adjusting the first signal divisor in response to the second signal divisor and adjusting the second signal divisor in response to the first signal divisor, said adjusting being performed so as to constantly maintain a product of the first divisor and the second divisor.

2. The frequency synthesizer according to claim 1, further comprising a loop filter for filtering the charge pump signal provided to the variable oscillator.

3. The frequency synthesizer according to claim 2, wherein said loop filter filters out high-frequency components from the charge pump signal.

4. The frequency synthesizer according to claim 1, wherein the loop adjustor one of receives the first divisor and adjusts the second divisor in response to a value of the received first divisor, and receives the second divisor and adjusts the first divisor in response to a value of the received second divisor.

5. The frequency synthesizer according to claim 1, wherein at least one of the first divisor and the second divider is user-programmable.

6. The frequency synthesizer according to claim 1, wherein the variable oscillator comprises one of a voltage-controlled oscillator and a current-controlled oscillator.

7. The frequency synthesizer according to claim 2, wherein respective characteristics of the phase detector, the charge pump, the loop filter, and the variable oscillator are held constant, while frequencies of the output signal of said frequency synthesizer are changed.

8. The frequency synthesizer according to claim 7, wherein the respective characteristics are set so that said frequency synthesizer is in a stable operating state.

9. The frequency synthesizer according to claim 1, wherein said frequency synthesizer is formed on a monolithic integrated circuit.

10. A frequency synthesizer, comprising:

a phase detector for detecting a phase difference between an input signal and a feedback signal and for generating a phase error signal corresponding to the detected phase difference;

a charge pump for generating a charge pump signal having a polarity controlled by the phase error signal;

a loop filter for filtering out high-frequency components from the charge pump signal to generate a filtered signal;

a variable oscillator for generating an oscillation signal in response to the filtered signal;

a first frequency divider for dividing a frequency of the oscillation signal by a first divisor to produce a first divided output signal as an output signal of said frequency synthesizer;

a second frequency divider for dividing a frequency of the first divided output signal by a second divisor to produce the feedback signal; and a loop adjustor for adjusting the first signal divisor in response to the second signal divisor so as to constantly maintain a value obtained when multiplying the first divisor by the second divisor.

11. The frequency synthesizer according to claim 10, wherein the loop adjustor receives the second divisor and provides the first frequency divider with a control signal to adjust the first divisor in response to the second divisor.

12. The frequency synthesizer according to claim 10, wherein the second divisor is user-programmable.

13. The frequency synthesizer according to claim 10, wherein respective characteristics of the phase detector, the charge pump circuit, the loop filter, and the variable oscillator are held constant, while frequencies of the output signal of said frequency synthesizer are changed.

14. A frequency synthesizer, comprising:

a phase detector for detecting a phase difference between an input signal and a feedback signal and for generating a phase error signal corresponding to the detected phase difference;

a charge pump for generating a charge pump signal having a polarity controlled by the phase error signal;

a loop filter for filtering out high-frequency components from the charge pump signal to generate a filtered signal;

a variable oscillator for generating an oscillation signal in response to the filtered signal;

a first frequency divider for dividing a frequency of the oscillation signal by a first divisor to produce a first divided output signal as an output signal of said frequency synthesizer;

a second frequency divider for dividing a frequency of the first divided output signal by a second divisor to produce the feedback signal; and a loop adjustor for adjusting the second signal divisor in response to the first signal divisor so as to constantly maintain a value obtained when multiplying the first divisor by the second divisor.

15. The frequency synthesizer according to claim 14, wherein the loop adjustor receives the first divisor and provides the second frequency divider with a control signal to adjust the second divisor in response to the first divisor.

16. The frequency synthesizer according to claim 14, wherein the first divisor is user-programmable.

17. The frequency synthesizer according to claim 14, wherein respective characteristics of the phase detector, the charge pump circuit, the loop filter, and the variable oscillator are held constant, while frequencies of the output signal of said frequency synthesizer are changed.

\* \* \* \* \*